United States Patent [19]
Walker et al.

[11] Patent Number: 6,130,117
[45] Date of Patent: Oct. 10, 2000

[54] SIMPLE BICMOS PROCESS FOR CREATION OF LOW TRIGGER VOLTAGE SCR AND ZENER DIODE PAD PROTECTION

[75] Inventors: John D. Walker; Todd A. Randazzo; Gayle W. Miller, all of Colorado Springs, Colo.

[73] Assignee: LSI Logic Corporation, Milpitas, Calif.

[21] Appl. No.: 09/081,475

[22] Filed: May 19, 1998

Related U.S. Application Data

[62] Division of application No. 08/768,905, Dec. 17, 1996, Pat. No. 5,821,572.

[51] Int. Cl.[7] .................................................... H01L 21/33
[52] U.S. Cl. ........................................................... 438/133
[58] Field of Search ................................... 438/328, 134, 438/140, 141, 322, 323, 324, 380, 983, 133; 257/107, 173

[56] References Cited

U.S. PATENT DOCUMENTS

| | | | |
|---|---|---|---|
| 5,077,591 | 12/1991 | Chen et al. | 257/109 |
| 5,225,702 | 7/1993 | Chatterjee | 257/360 |
| 5,274,262 | 12/1993 | Avery | 257/362 |
| 5,343,053 | 8/1994 | Avery | 257/173 |
| 5,453,384 | 9/1995 | Chatterjee | 438/135 |
| 5,455,436 | 10/1995 | Cheng | 257/356 |
| 5,465,189 | 11/1995 | Polgreen et al. | 361/58 |
| 5,473,169 | 12/1995 | Ker et al. | 257/173 |
| 5,485,024 | 1/1996 | Reay | 257/173 |
| 5,493,133 | 2/1996 | Duvvury et al. | 257/111 |
| 5,500,546 | 3/1996 | Marum et al. | 257/358 |
| 5,506,742 | 4/1996 | Marum | 361/56 |
| 5,661,687 | 8/1997 | Randazzo | 365/185.24 |
| 5,808,342 | 9/1998 | Chen et al. | 257/357 |
| 5,821,572 | 12/1998 | Walker et al. | 257/107 |
| 5,856,214 | 1/1999 | Yu | 438/133 |

FOREIGN PATENT DOCUMENTS

| | | | |
|---|---|---|---|
| 0785576 | 7/1997 | European Pat. Off. | H01L 27/02 |

OTHER PUBLICATIONS

Bipolar SCR ESD Protection Circuit for High Speed Submicron Bipolar/BiCMOS Circuits; 1995 IEEE; Julian Z. Chen et al.; pp. 14.1.1–14.1.4.

*Primary Examiner*—Charles Bowers
*Assistant Examiner*—Evan Pert

[57] ABSTRACT

The present invention provides a semiconductor protection device in a substrate having a first type of conductivity. The semiconductor protection device includes two vertical bipolar transistors. A well region is located within the substrate having a second type of conductivity with a base region within the well region having a first type of conductivity. A first doped region having the second type of conductivity and a second doped region having a first type of conductivity are located within the well region. A third doped region having the second type of conductivity and a fourth doped region having the first type of conductivity are located within the base region. A doped region having a first type of conductivity is located within the substrate. This doped region is connected to the fourth doped region.

6 Claims, 8 Drawing Sheets

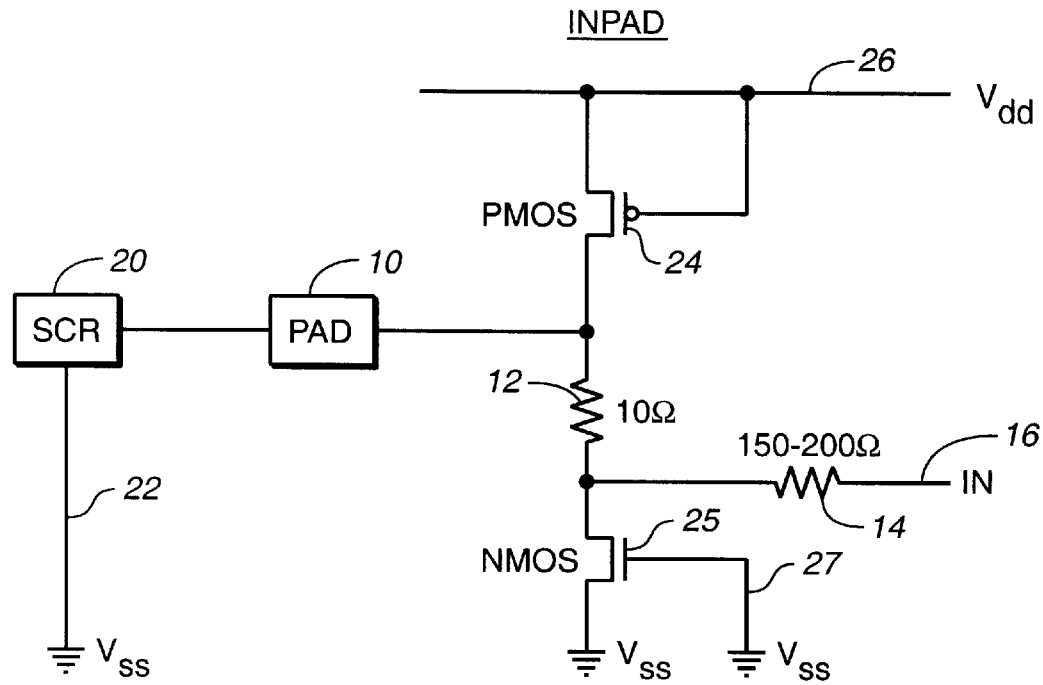
FIG._1
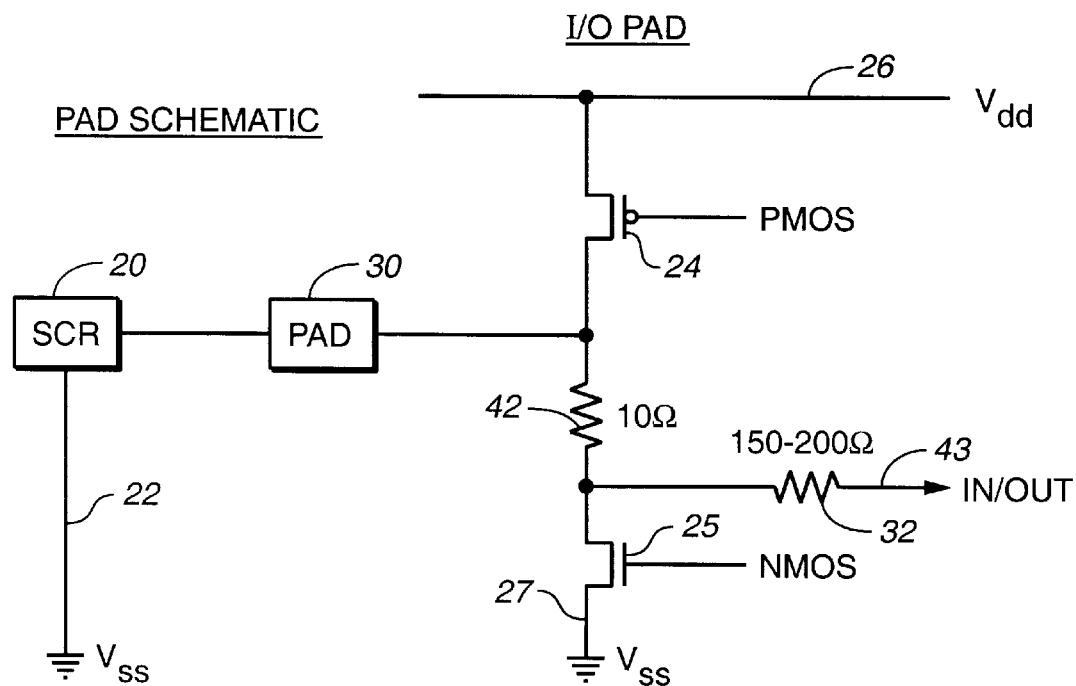
FIG._2

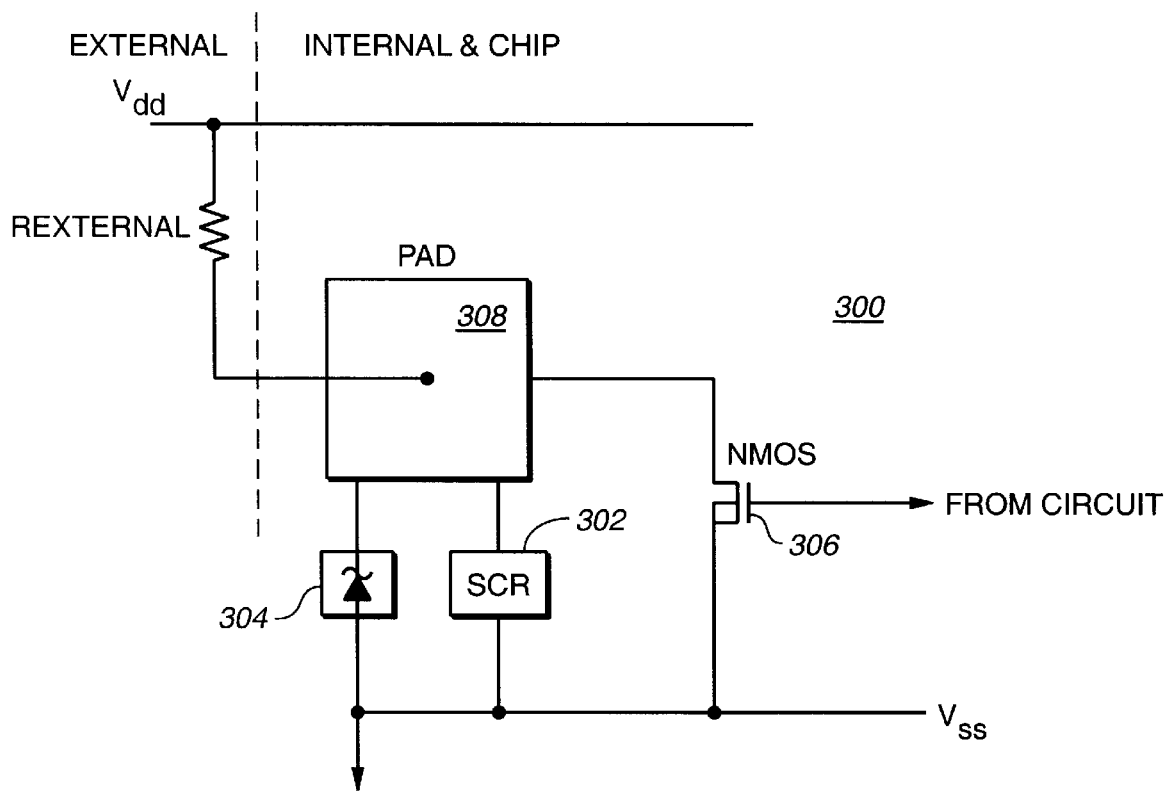
FIG._3

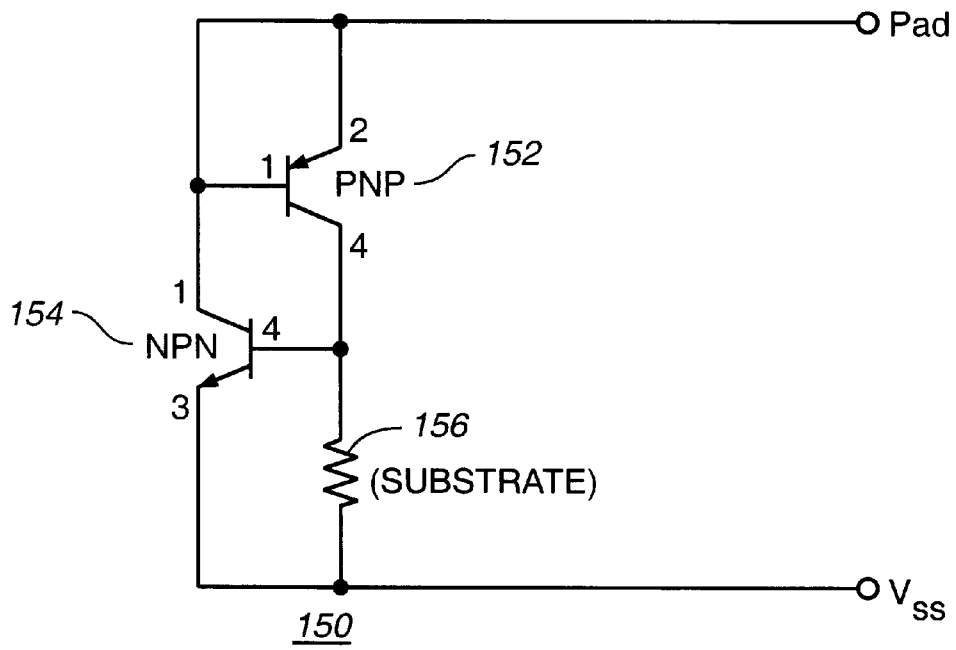
FIG._4A
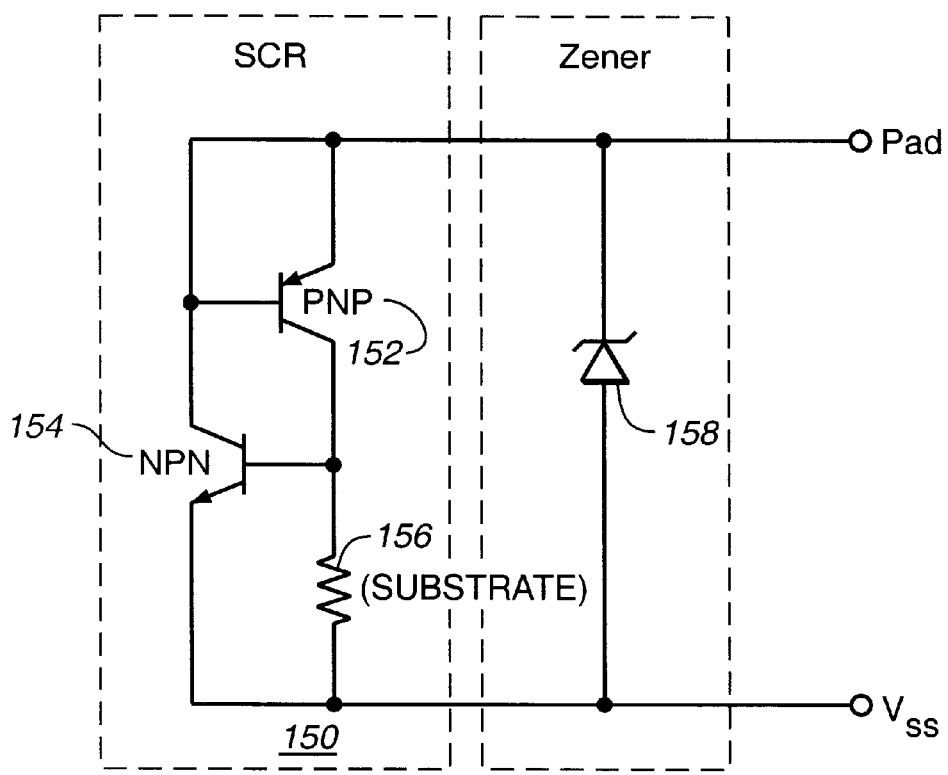
FIG._4B

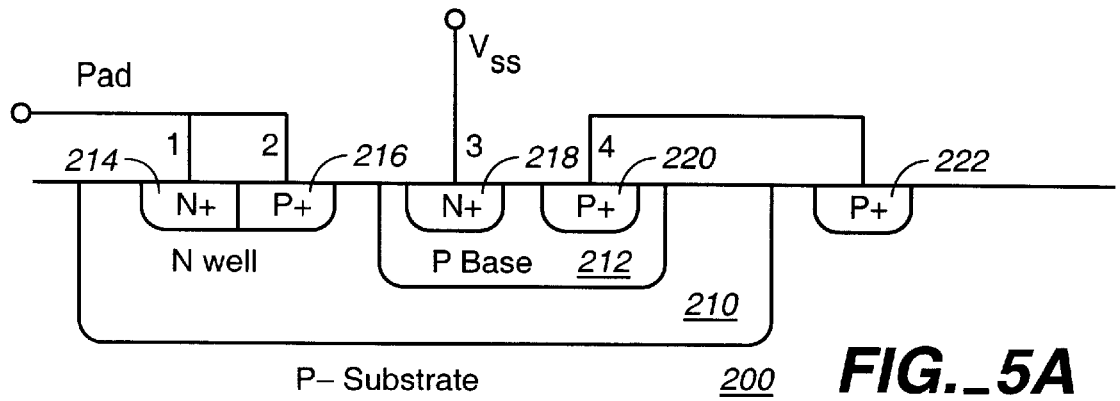
FIG._5A
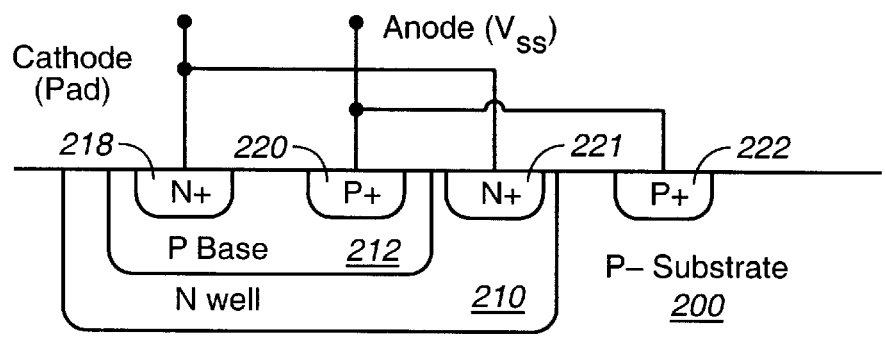
FIG._5B
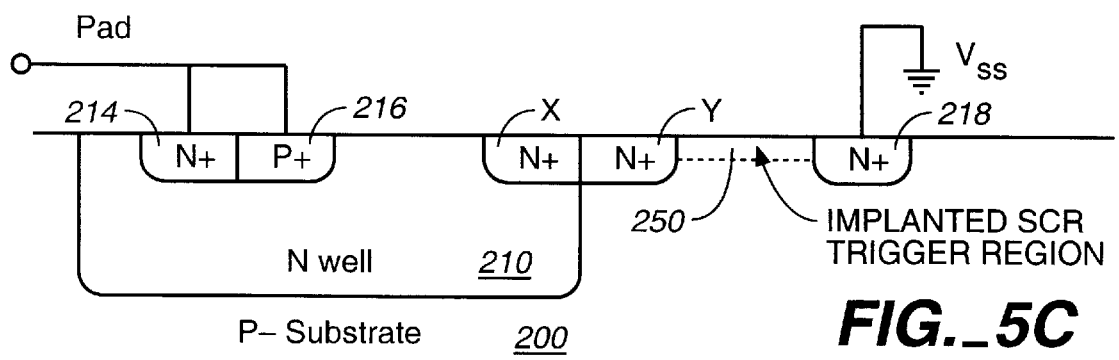
FIG._5C

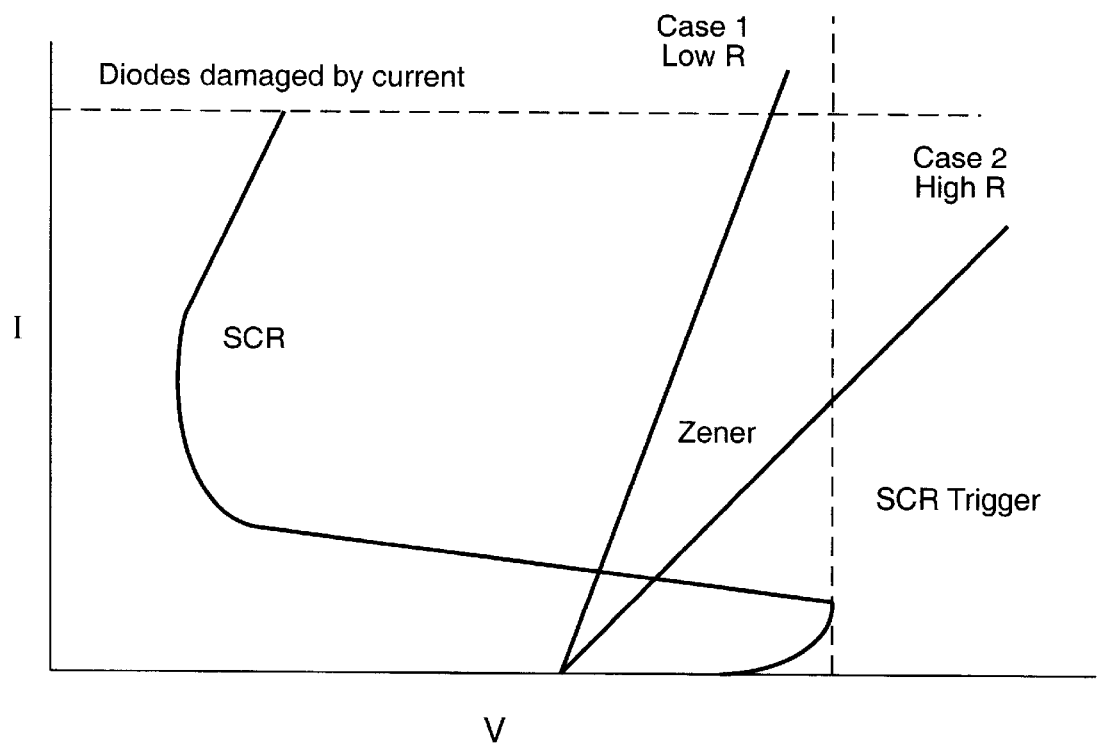
FIG._5D

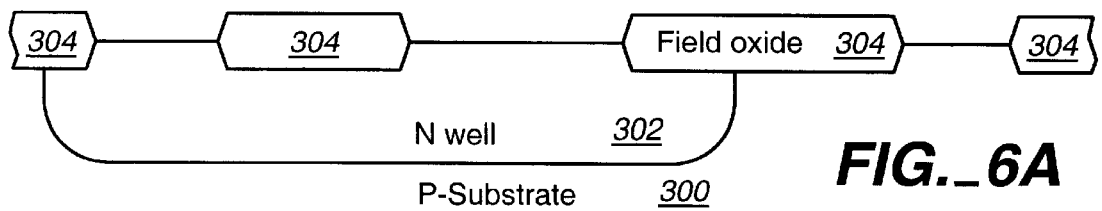
FIG._6A
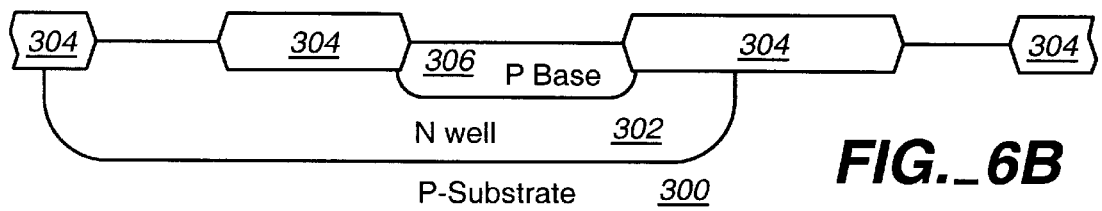
FIG._6B
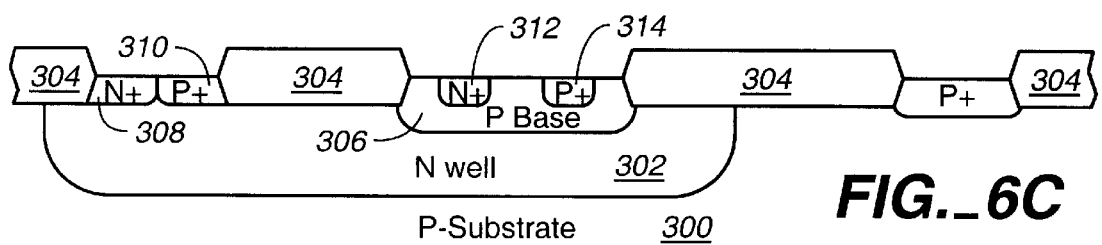
FIG._6C
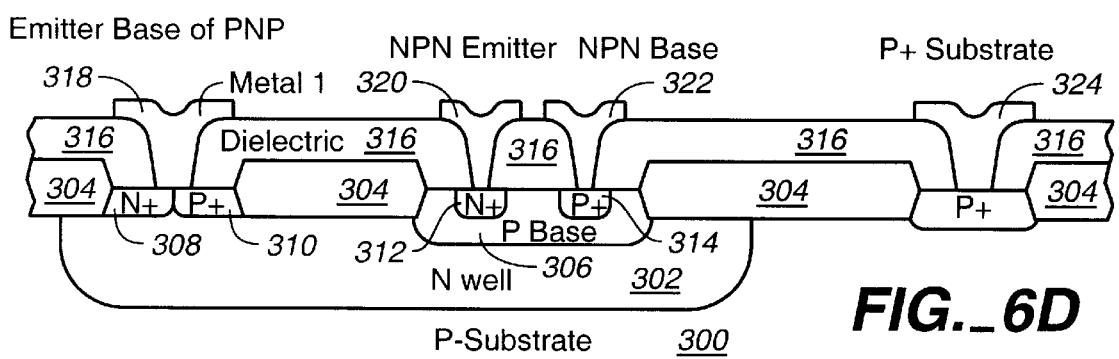
FIG._6D

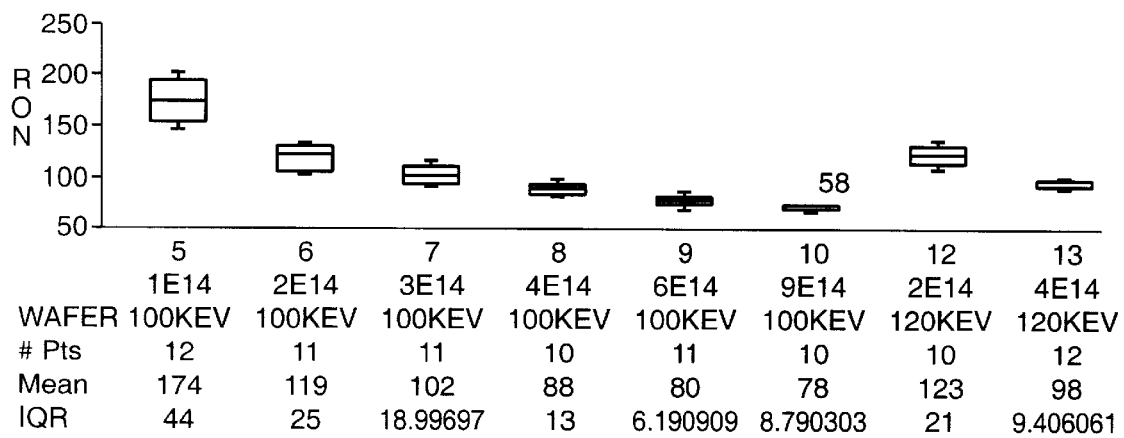
FIG._7A
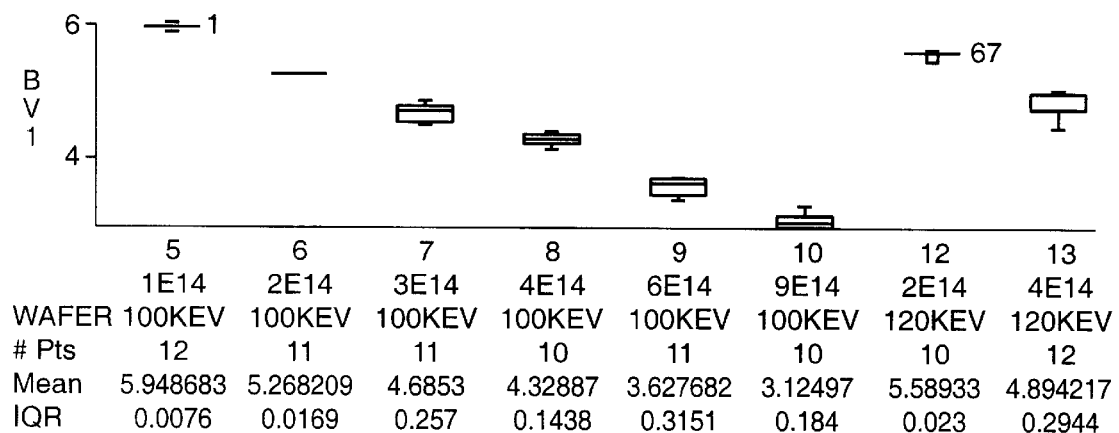
FIG._7B
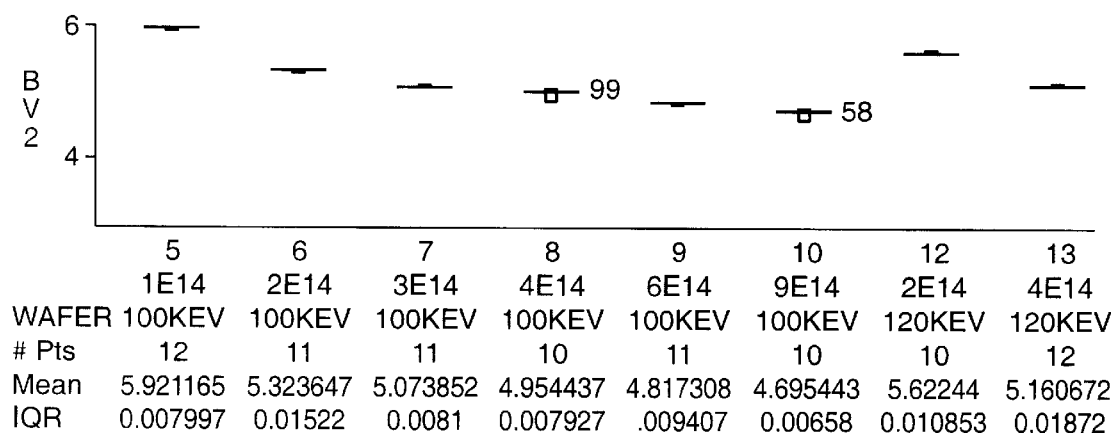
FIG._7C

Signal Name: Part number:

|         | 1  | 2 | 3 | 4  | 5  | 6  | 7  | 8  | 9 | 10 | 11 | 12 |
|---------|----|---|---|----|----|----|----|----|---|----|----|----|
| SCSI0_1 | .  | . | . | .  | VF | .  | .  | .  | . | .  | .  | .  |
| SCSI0_2 | .  | . | . | .  | VF | .  | .  | .  | VF| .  | .  | .  |
| SCSI0_3 | .  | . | . | VF | .  | .  | VF | .  | . | .  | .  | .  |
| SCSI1_1 | .  | . | . | VF | VF | VF | VF | .  | . | .  | .  | .  |
| SCSI1_2 | .  | . | . | .  | .  | VF | .  | VF | . | .  | .  | .  |
| SCSI1_3 | .  | . | . | VF | .  | .  | VF | .  | . | .  | .  | .  |
| SCSI2_2 | SF | . | . | .  | .  | .  | .  | .  | . | SF | SF | .  |
| SCSI2_2 | SF | . | . | .  | .  | .  | .  | .  | . | SF | SF | .  |
| SCSI2_3 | .  | . | . | .  | .  | .  | .  | .  | . | .  | .  | .  |
| SCSI3_1 | .  | . | . | .  | .  | .  | .  | .  | . | .  | .  | .  |
| SCSI3_2 | .  | . | . | .  | .  | .  | .  | .  | . | .  | .  | .  |
| SCSI3_3 | .  | . | . | .  | .  | .  | .  | .  | . | .  | .  | .  |
| SCSI4_1 | SF | . | . | .  | .  | .  | .  | .  | . | SF | SF | .  |
| SCSI4_2 | SF | . | . | .  | .  | .  | .  | .  | . | SF | SF | .  |
| SCSI4_3 | SF | . | . | .  | .  | .  | .  | .  | . | SF | SF | .  |
| SCSI5_1 | .  | . | . | .  | .  | .  | .  | .  | . | .  | LF | .  |
| SCSI5_2 | .  | . | . | .  | .  | .  | .  | .  | . | .  | .  | .  |
| SCSI5_3 | .  | . | . | .  | .  | .  | .  | .  | . | .  | .  | .  |

Key:

SF = Shorts failure
VF = Voltage feedthru failure
LF = Leakage failure

SCSI0 – Standard SCSI pad (baseline)
SCSI1 – Standard SCSI pad w/o SCR
SCSI2 – Standard SCSI pad with zener1, no SCR
SCSI3 – Standard SCSI pad with both zener1, and SCR
SCSI4 – Standard SCSI pad with zener2, no SCR
SCSI5 – Standard SCSI pad with both zener2 and SCR

*FIG._8*

SIMPLE BICMOS PROCESS FOR CREATION OF LOW TRIGGER VOLTAGE SCR AND ZENER DIODE PAD PROTECTION

This is a Division of application Ser. No. 08/768,905, filed Dec. 17, 1996 now U.S. Pat. No. 5,821,572.

BACKGROUND OF THE INVENTION

1. Technical Field

The present invention relates generally to integrated circuits and in particular to improved protection devices for integrated circuits. Still more particularly, the present invention relates to an improved device and method for manufacturing electrostatic discharge and overvoltage protection devices for integrated circuits.

2. Description of the Related Art

Electrostatic discharge (ESD) phenomena commonly result from pulses of high voltage, (typically, several kilovolts), moderate current (a few amperes) and short duration (on the order of 100 nanoseconds) generated by a variety of sources, such as human bodies, electric fields generated by machinery, and the like.

ESD effects are a common problem in integrated circuits (IC) electronics and are particularly troublesome in complimentary metal-oxide-semiconductor (CMOS) devices, which have particularly thin gate oxides and very short channel devices. Such structures can typically withstand only a few tens of volts. An ESD pulse conducted through a CMOS IC can induce oxide rupture and device or interconnect burnout. An ESD pulse can also induce a "latch-up" condition in thick field devices.

ESD problems can be abated somewhat by including appropriate anti-static protection on circuit boards on which the ICs are installed. The ICs, however, still are susceptible to ESD before and during the circuit board fabrication process. A general personal awareness of ESD problems and countermeasures, such as electrically grounded bracelets and the like reduce risks in this phase of the IC lifespan. It is, however, at best, a partial solution. Therefore, it is desirable to include ESD protection circuitry within the IC itself.

Overvoltage pulses caused by reflection of voltage pulses result in voltages much higher than the operating voltage of the IC. Such a situation occurs with SCSI devices that are connected to a SCSI bus containing other active SCSI devices. In such situations, overvoltage pulses return from the bus to the ICs in the SCSI device. These pulses can damage the gates or devices in the IC. Typically, diodes are added across the pads of the chip to protect the IC from overvoltage pulses. Traditional diode structures, however, typically have capacitances that are higher than desired for SCSI devices when added externally to the IC. In particular, small computer system interface (SCSI) devices can only tolerate a 1 pF loading capacitance. Line bounce may cause an increase in voltage up to two times the original voltage.

Therefore, it would be advantageous to have an improved method and device that can be used to provide both ESD and overvoltage protection for ICs.

SUMMARY OF THE INVENTION

The present invention provides a semiconductor protection device in a substrate having a first type of conductivity. The semiconductor protection device includes two vertical bipolar transistors. A well region is located within the substrate having a second type of conductivity with a base region within the well region having a first type of conductivity. A first doped region having the second type of conductivity and a second doped region having a first type of conductivity are located within the well region. A third doped region having the second type of conductivity and a fourth doped region having the first type of conductivity are located within the base region. A doped region having a first type of conductivity is located within the substrate. This doped region is connected to the fourth doped region.

The semiconductor protection device provides electrostatic protection by connecting the first doped region and the second doped region to a pad and by connecting the third doped region to a lower power supply voltage, such as VSS. Overvoltage protection is provided by connecting the fourth doped region to the pad instead of the first and second doped regions.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a schematic diagram illustrating an ESD protection circuit on an input pad having an SCR fabricated according to the present invention;

FIG. 2 depicts a schematic diagram of another ESD protection circuit on an input/output pad having an SCR fabricated according to the present invention;

FIG. 3 depicts a schematic diagram of a SCSI open drain driver containing a zener diode and an SCR according to the present invention;

FIGS. 4A and 4B are schematic diagrams of an SCR with connections to provide ESD protection according to the present invention;

FIG. 5A depicts cross-sections of a BICMOS SCR with connections corresponding to the schematic diagrams in FIG. 4A according to the present invention;

FIG. 5B depicts a cross-section of a reverse biassed zener diode corresponding to the schematic diagram in FIG. 4A according to the present invention;

FIG. 5C depicts the traditional SCR which is triggered by the breakdown voltage of the lateral NPN according to the present invention;

FIG. 5D depicts the current voltage characteristics of the pad with parallel zener and SCR shown in FIG. 4B according to the present invention;

FIGS. 6A–6D are cross-sections illustrating a process for fabricating a BICMOS SCR and zener diode with connections depicted according to the present invention.

FIG. 7A is a graph of the on resistance of an emitter-based diode configuration of the SCR according to the present invention;

FIG. 7B is a graph of the breakdown voltage of an emitter-based diode configuration of the SCR according to the present invention;

FIG. 7C is a graph of the extrapolated breakdown voltage of the emitter-based diode configuration of the SCR according to the present invention; and FIG. 8 is a table of test results comparing different configurations of protection devices with pads according to the present invention.

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections and layouts of portions of an integrated circuit during fabrication are not drawn to scale, but instead are drawn so as to illustrate the important features of the invention.

The present invention will be described with reference to a CMOS process. However, those of ordinary skill in the art will appreciate that selecting different dopant types and adjusting concentrations allows the invention to be applied to PMOS, NMOS, and other processes that are susceptible to latch-up or damage caused by ESD.

A typical CMOS device has wells of N-type and P-type dopants separated by field oxide. Within a N-well, P-type source and drain regions are formed. In neighboring P-wells, N-type source and drain regions are formed. Bipolar devices also may be formed. Parasitic PnPn regions exist throughout the circuit. If an ESD pulse injects a voltage spike into the circuit, the pulse can cause damage to the circuit, usually by exceeding the gate oxide breakdown voltage.

According to the present invention, a protection device having a structure that may be employed as a low trigger voltage silicon controlled rectifier (SCR) and as an overvoltage protection device is provided. Used as a SCR, the structure of the present invention protects input and output pads from ESD pulses. The current invention describes a low breakdown zener diode. The zener diode acts as a vertical NPN trigger device. The vertical NPN trigger device replaces the use of the traditional lateral NPN thick field device.

The zener device can also be configured with a traditional SCR to protect SCSI pads from overvoltage conditions and for ESD protection at the same time. The traditional SCR is triggered by a lateral NPN thick field device.

In the past, expensive, discreet diodes have been added to chips on the circuit board for overvoltage protection. The diode described in this invention provides a much less expensive alternative. In addition, the diode described has a capacitance of 0.5 pF. The diode can also be integrated within the process to provide a low performance, vertical NPN BJT device for analog functions.

The SCR is used to shunt ESD pulses away from the sensitive gate oxide structures within the circuit. The zener diode is used to shunt overvoltage pulses away from the sensitive gate oxide structures.

The breakdown voltage of the vertical NP zener diode, which can be used to trigger the SCR or to act as a shunt for overvoltage protection, is set by the implant conditions of the boron base implant and subsequent thermal process steps.

With reference now to the figures and in particular with reference to FIG. 1, a schematic diagram illustrates an ESD protection circuit having an SCR fabricated according to the present invention. An input pad 10 connects through resistors 12 and 14 to an IN signal line 16, which connects to other circuitry on the IC. An SCR 20 provides an independent conduction path 22 to VSS. Resistors 12 and 14 limit the current flow onto signal line 16, which in turn provides time for SCR 20 to turn on and shunt the ESD pulse to VSS.

In the depicted example, resistor 12 may have a resistance of 10 Ω while resistor 14 may have a resistance between 150 Ω and 200 Ω. PMOS transistor 24 and NMOS transistor 25 are provided for tying signal line 16 to VDD and VSS.

Turning now to FIG. 2, a schematic diagram of another ESD protection circuit having an SCR fabricated according to the present invention is depicted. Many of the circuit elements are identical to the one shown in FIG. 1, and the elements that are the same in FIGS. 1 and 2 are designated with the same reference numerals.

An input/output pad 30 connects through a 10 Ω polysilicon resistor 42 onto an IN/OUT signal line 43, which connects to other circuitry on the chip. As in FIG. 1, two transistors are included, PMOS device 24 and NMOS device 25, to tie IN/OUT signal line 43 to VDD and VSS connections, respectively. SCR 20, when in its "ON" mode, provides an independent conduction path 22 from input/output pad 30 to VSS. Resistor 32 limits current flow onto signal line 43, which in turn provides time for SCR 20 to turn on and shunt the ESD pulse to VSS.

The trigger device of the SCR is formed by a vertical NPN transistor in which boron is implanted to select the breakdown voltage, thus setting the trigger voltage of the trigger device and the SCR. SCR 20 is formed by connecting the trigger device with a vertical PNP device. The base and emitter of the NPN are common. The base and emitter of the PNP are common. More information on SCRs may be found in U.S. patent application Ser. No. 08/129,224, filed Sep. 29, 1993 entitled Field Implant for Silicon Controlled Rectifier, which is incorporated herein by reference.

In FIG. 3, a schematic diagram of a SCSI open drain input/output device 300 is depicted according to the present invention. The open drain structure is required to satisfy the SCSI bus requirements specification.

In the depicted example, a field triggered SCR 302 (any other type of SCR could be used) is put between VSS and pad 308. The SCR 302 triggers at 8.5 V, at which point it switches to the hold state of approximately 2 V. SCR 302 prevents ESD pulses from damaging pad 308.

A zener diode 304 is also connected between VSS and the pad to protect against other voltage spikes. Zener diode 304 starts to conduct at 5 V, the reverse diode breakdown voltage. This prevents the overvoltage spike from damaging the gate oxide of NMOS gate in transistor 306.

During an ESD pulse, zener diode 304 affects the triggering mechanism of SCR 302. If the resistance of zener diode 304 is too low, the current through zener diode 304 will thermally damage the zener device before the SCR trigger voltage is reached. If the resistance of zener diode 304 is too high, then the voltage across the NMOS gate in transistor 306 rises to unacceptable levels. Layout of zener diode 304 and selection of the zener breakdown voltage and resistance is important to insure that the ESD protection overvoltage protection of the pad works.

Zener diode 304 cannot, however, be used as a vertical NPN bipolar device to trigger the SCR for overvoltage protection on SCSI pads under the SCSI bus specification which requires that there is very low leakage through pad 308 at a voltage higher than the SCR hold voltage. Pad 308 would conduct and show current leakage while SCR 302 was triggered. Pad 308 would not stop leaking until it was powered down below the SCR hold voltage.

The SCSI specs state that $I_{ih}$ (high level input current) should be less than 20 microamps at 2.7 V. This specification is defined in the American National Standard Institute Specification for Information Systems SCSI-3 Fast-20 and SCSI-3 Parallel Interface specifications.

FIG. 4A is a schematic diagram of a SCR 150 with connections to provide ESD protection according to the present invention. SCR 150 in FIG. 4A is connected to provide ESD protection and is configured to provide overvoltage protection in FIG. 4B. SCR 150 includes a NPN transistor 154 and a PNP transistor 152 and a resistor 156 (formed by the substrate) connected as an SCR to provide ESD protection. The emitter of PNP transistor 152 is connected to the pad while the collector of PNP transistor 152 is connected to VSS. In FIG. 4B, SCR 150 is connected to the pad and VSS to provide ESD protection. The zener diode 158 is connected to provide overvoltage protection.

With reference now to FIGS. 5A and 5B, cross-sections of a BICMOS SCR and zener diode, respectively, with connections corresponding to the schematic diagrams in FIGS. 4A and 4B are depicted according to the present invention. FIG. 5A depicts the connections for SCR 150 device while FIG. 5B illustrates connections for zener diode 158. The SCR and zener structure employs a BICMOS process flow in which an additional masked boron implant is performed during the CMOS process flow to create a simple bipolar base structure. The SCR shunts ESD pulses. The zener structure shunts overvoltage pulses that are at a higher voltage than the gate oxide thickness allows, thus preventing gate oxide failure. FIG. 5C shows the traditional SCR, which is triggered by the breakdown voltage of the lateral NPN. The breakdown voltage is modulated by selectively implanting the field region with boron.

In FIGS. 5A and 5B substrate 200 is a P− substrate in the depicted example. A N-well 210 is implanted in substrate 200 for FIG. 5A for the SCR. The masking and implantation of base region 212 may be employed at various steps in the CMOS process flow. In the depicted example, the base is a P-type base. Additionally, doped regions 214–222 are implanted to create the SCR device. In FIG. 5A, doped regions 214 and 218 are N+ doped regions while doped regions 216 and 220 are P+ doped regions; doped region 222 is a P+ region. Doped region 214 corresponds to node 1 in FIG. 4A while doped region 216 corresponds to node 2 in FIGS. 4A and 4B. These doped regions are connected to the pad in the depicted example. Doped region 218 corresponds to node 3 and is connected to lower power supply voltage VSS. Doped region 220 corresponds to node 4 and is connected to region 222. The substrate provides the resistance for resistor 156 shown in FIGS. 4A and 4B.

In FIG. 5B, doped region 218 forms the cathode of the zener diode and is connected to the pad while doped region 220 forms the anode of the zener diode and is connected to power supply voltage VSS. Additionally, a doped region 221 is formed within N-well 210 and connected to doped region 218. Doped region 220 has a connection to doped region 222. Doped region 221 is a N+ doped region.

In FIG. 5C, an additional mask and implant is present to form the implanted SCR trigger region 250. The function of the implant is to reduce the reverse diode breakdown of the N+ to P− substrate diode. In the depicted example, the doped regions are shallow high doped regions. High doped regions are regions that are implanted between about 1e15 ion/cm$^2$ and about 6e15 ions/cm$^2$. A shallow region is defined as a junction with a depth between about 0.05 µm and about 0.5 µm.

With reference now to FIG. 5D, a graph of characteristics of a reverse biased zener diode in parallel with an SCR is depicted according to the present invention. When used in conjunction with a higher trigger voltage SCR, the reverse biased zener diode is designed to operate between two cases.

In the first case, low resistance zener, as depicted in FIG. 5D, the zener diode prevents SCR triggering keeping the pad voltage below the SCR trigger voltage. During an ESD event, diode damage will occur in the zener diode if the current level exceeds the zener diode damage limit. In the second case, high resistance zener, the SCR triggers during an ESD pulse before the zener diode or the SCR is damaged, but the resistance of the zener diode allows excessive voltage to build up on sensitive gate oxide nodes, causing gate damage during times when overvoltage protection is active. Consequently, the zener diode must be designed to operate between a low resistance zener and a high resistance zener case as shown in FIG. 5D.

The methods employed to integrate the base into the standard CMOS flow to set the emitter-base breakdown, to provide good bipolar characteristics in a forward direction, and to provide a high early voltage, are well-known. The present invention provides a unique combination of the BICMOS flow with an SCR to protect internal circuits from ESD pulses. The same zener diode can be used to protect against SCSI related overvoltages.

In the depicted example, the boron base is masked and implanted at a similar point in the CMOS flow as the doped implants. Base region 212, in the depicted example, is created by implanting a boron dopant below the maximum and extent of the N+ emitter. The base width of the bi-polar device is approximately 0.4 µm to about 0.6 µm employing an implant dose between $1e14/cm^{-2}$ and $1e15/cm^{-2}$. This implant dose is implanted at an energy of about 80 KeV to about 140 KeV using a thermal activation of 800° C. for 30 minutes and 900° C. for two minutes.

With reference now to FIGS. 6A–6D, cross-sections illustrating a process for fabricating a BICMOS SCR and zener diode connections are depicted according to the present invention. Substrate 300 in FIG. 6A has an N-well 302 implanted within it. Field oxide regions 304 are then defined and grown. Thereafter, p-based region 306 is implanted within N-well 302 as illustrated in FIG. 6B. Next, n+ doped region 308 and p+ doped region 310 are implanted into N-well 302. Additionally, n+ doped region 312 and p+ doped region 314 are implanted into p-base 306 in FIG. 6C. Thereafter, in FIG. 6D, dielectric 316 is deposited and etched and contacts 318–324 are formed from metal I. Contact 318 forms a contact for the emitter n-base of the PNP transistor. Contact 320 is for the emitter of the NPN transistor, while contact 322 is for the base of the NPN transistor. Contact 324 forms a connection to the p+ substrate.

The SCR is created by connecting the vertical PNP and vertical NPN device. Although the CMOS process, as described in the depicted example, is based on a P-type substrate, a similar N-type scheme could be built by switching the dopant types as well as pad and ground connections in the flow.

The base (N-well) and emitter (P+) of the vertical PNP are tied together and are attached to the input pad that requires the ESD protection. The emitter of the vertical NPN device is connected to the lower power supply voltage VSS or ground. The base of the vertical NPN is connected to the collector of the vertical PNP. In the depicted example, the vertical NPN device is connected to the base of the vertical PNP device. The vertical NPN device is built with an N+ doped implanted emitter, a P-doped base, and an N-well collector. The base mask overlaps the N+ emitter enough to prevent the N+ emitter to N-well collector shorts. The base mask also provides enough space to allow for a P+ region to provide a low resistance connection to the base. The trigger voltage of this SCR is set by the breakdown voltage of the vertical NPN device, which is in turn set by the implant conditions of the boron base implant and subsequent diffusion steps. The vertical PNP device is formed by the P+ doped emitter, the N-well base, and P-substrate collector.

FIGS. 7A, 7B, and 7C are boxplot graphs. The on resistance characteristic of an emitter-base diode is shown in FIG. 7A. The X-axis shows the base implant conditions, and the Y-axis shows the on resistance. FIG. 7B is a graph of the breakdown voltage of an emitter-base diode at 1 $\mu$A. The X-axis value in this graph refers to base implant conditions of boron as dose $cm^{-2}$ and boron implant energy KeV. The Y-axis shows the diode breakdown at 1 $\mu$A. This plot shows a transition between the avalanche and zener breakdown mechanisms at approximately 5 volts, which is indicated by the increased variation in breakdown voltage. FIG. 7C is a graph of the extrapolated breakdown voltage, extrapolated to a zero current from 1 mA and 10 mA of the emitter-based diode. The X axis refers to the implant conditions in boron dose $cm^{-2}$ and boron energy KeV cm, the Y-axis refers to the extrapolated breakdown voltage.

When the voltage across the gate oxide exceeds ten MV/cm (8.0 V for a 80 Å gate) the voltage exceeds the dielectric strength of the oxide, causing destructive oxide breakdown. When the voltage across the gate exceeds seven MV/cm (5.6 V for a 80 Å gate) an appreciable tunnelling current occurs through the gate. Some carriers are thus trapped in the gate oxide. In due course, these trapped charges lead to a reduction in the gate oxide breakdown voltage, and thus have a detrimental affect on gate oxide reliability over time. The present invention shunts ESD or overvoltage stresses away from the gate oxide structures to improve the reliability of an integrated circuit device employing the SCR of the present invention. With ICs designed to operate with a 3.3 voltage power supply, a device providing ESD protection should have the following characteristics:

(1) trigger at a voltage that is greater than the maximum upper power supply voltage (i.e. VDD);

(2) trigger at a voltage that is less than about 85% of the gate oxide breakdown voltage;

(3) be stable at high power while the SCR is in the "ON" mode;

(4) provide stability (low leakage) at maximum rated temperature while the SCR is in the "OFF" mode;

(5) snap back to a low voltage state after triggering to reduce power consumption; and (6) have low on state resistance.

For overvoltage protection and for SCSI pads in particular, the protection device should clamp the voltage to prevent gate oxide stressing, but should not switch to a low voltage state. The protection device should have low capacitance to avoid degrading the performance of the SCSI bus. In addition, the diode shown in this invention has a capacitance of less than 1 pF and is placed internally within the integrated circuit.

Previous protection schemes have used discreet diodes placed externally to the integrated circuit. The diode has high capacitance and high cost.

One big advantage provided by the present invention is that no extra cost is incurred by having to add diodes externally to the integrated circuit.

The zener diode, however, cannot be used as a vertical NPN bipolar device to trigger the SCR for overvoltage protection on SCSI pads because the SCSI bus specification requires that there is very low leakage through the pad at a voltage higher than the SCR hold voltage. The pad would conduct and leak current while the SCR was triggered. The pad would not stop leaking until it was powered down below the SCR holding voltage. The holding voltage is defined as the lowest voltage that the SCR switches to in the "ON" state.

With reference now to FIG. 8, a table of test results comparing different configurations of protection devices with pads is depicted according to the present invention. Pads were tested using standard testing methods to 4,000 V human body models. The ESD specification is greater than 2,000 V. A higher protection was selected to guardband the specification. Pads were tested with and without the field implanted SCR and with and without the zener diode. Two types of zener diodes were tested. As can be seen with reference to FIG. 8, the configuration using a pad with a zener diode and a SCR in parallel showed the best result. The pad that worked for SCSI standards was the pad employing the field implemented SCR and the zener, as shown in FIGS. 4A and 4B. The zener diode also protects the pad structure from overvoltage stress according to the present invention.

Thus, the present invention provides a protection device with the desirable characteristics required for both ESD and overvoltage protection. In the depicted example, this type of protection is provided by an implanted trigger device within the SCR to trigger at about 80% of the gate breakdown voltage and a zener diode in the reverse mode that triggers at about 5.0 V and is resistive, rather than switching, above 5.0 V to provide overvoltage protection. Avalanche breakdown is required to reduce the off current leakage at high temperatures and prevent leakage induced triggering.

As described, the zener diode can be integrated into the SCR to provide a switching structure that triggers at around 5 V, this trigger can be adjusted from 4.5 V to 10 V by adjusting implant parameters.

Also, the base implant can be used to construct a low performance BJT bipolar device that can be used for traditional BICMOS operation and also for analog device operation.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A method of providing semiconductor circuit protection comprising:

doping a first region located within a well region within a substrate with a first conductivity type of dopant, wherein the first region forms first doped region;

forming a first vertical bipolar transistor by:

doping the substrate with a second conductivity type of dopant to form a first collector;

doping the well region within the substrate with the first conductivity type of dopant to form a first base; and doping a second doped region located within the well region with the second conductivity type of dopant to form a first emitter;

forming a second vertical bipolar transistor by:

doping a base region within the well region and with the second conductivity type of dopant to form a second base; and doping a third doped region located within the base region with the first conductivity type of dopant to form a second emitter, wherein the well region comprises a second collector of the second vertical bipolar transistor;

doping a fourth doped region located within the base region with the second conductivity type of dopant to form a contact region to the base of the second vertical bipolar transistor;

doping a fifth doped region located within the substrate with the second conductivity type of dopant to form a contact region to the substrate; and connecting the fifth doped region to the fourth doped region.

2. The method of claim 1 further comprising connecting the first doped region and the emitter of the first vertical bipolar transistor to a pad and connecting the emitter of the second bipolar transistor to a lower power supply voltage to form an SCR for ESD protection.

3. The method of claim 1 further comprising connecting the emitter of the second bipolar transistor to a pad and connecting the fourth doped region to a power supply voltage to form a zener diode for overvoltage spike protection.

4. The method of claim 1 further comprising:

doping a second well region within the substrate with the first conductivity type of dopant;

doping a second base region located within the second well region with the second conductivity type of dopant;

doping a sixth doped region located within the second base region with the first conductivity type of dopant;

doping a seventh doped region located within the second base region with the second conductivity type of dopant;

doping an eighth doped region located within the substrate with the second conductivity type of dopant; and connecting the eighth doped region to the seventh doped region.

5. The method of claim 4 further comprising:

connecting the first doped region and the emitter of the first vertical bipolar transistor to a pad and connecting the emitter of the second bipolar transistor to a lower power supply voltage to form a SCR for ESD protection; and connecting the sixth doped region to the pad and connecting the seventh doped region to the power supply voltage to form a Zener diode for overvoltage spike protection, wherein the Zener diode is connected in parallel to the SCR.

6. The method of claim 5 further comprising providing the SCR with a higher trigger voltage than a reverse bias breakdown voltage of the zener diode.

* * * * *